United States Patent [19]

Clarke

[11] Patent Number: 5,278,027
[45] Date of Patent: Jan. 11, 1994

[54] METHOD AND APPARATUS FOR MAKING PRINT IMAGING MEDIA

[75] Inventor: F. G. E. Clarke, Essex, Conn.

[73] Assignee: R. R. Donnelley, Chicago, Ill.

[21] Appl. No.: 629,473

[22] Filed: Dec. 18, 1990

Related U.S. Application Data

[63] Continuation-in-part of Ser. No. 321,292, Mar. 8, 1989, abandoned.

[51] Int. Cl.⁵ .............................. G03F 7/16; B41C 1/10
[52] U.S. Cl. .................................. 430/307; 430/300; 430/302; 430/306; 430/325; 430/327; 430/394; 430/945; 101/328; 101/401.1; 427/435
[58] Field of Search ................ 430/307, 302, 327, 945, 430/306, 394, 300, 325; 427/435; 101/328, 401.1

[56] References Cited

U.S. PATENT DOCUMENTS

| | | | |
|---|---|---|---|
| 2,212,234 | 8/1940 | Henderson | 430/307 |
| 2,256,777 | 9/1941 | Kaulen | 427/435 |
| 2,489,456 | 11/1949 | Libel | 427/435 |
| 2,808,344 | 5/1954 | Kaulen et al. | 427/435 |
| 4,020,762 | 5/1977 | Peterson | 430/945 |
| 4,063,949 | 12/1977 | Uhlig et al. | 430/945 |
| 4,264,705 | 4/1981 | Allen | 430/281 |
| 4,266,007 | 5/1981 | Hughes et al. | 430/281 |
| 4,275,143 | 6/1981 | Sakurai | 430/307 |
| 4,291,118 | 9/1981 | Boduch et al. | 430/327 |
| 4,298,680 | 11/1981 | Bruno | 430/306 |
| 4,339,472 | 7/1982 | Tachibana et al. | |
| 4,500,629 | 2/1985 | Irving et al. | 430/327 |
| 4,504,354 | 3/1985 | George et al. | |
| 4,537,855 | 8/1985 | Ide | 430/288 |
| 4,550,072 | 10/1985 | Lynch et al. | 430/307 |
| 4,577,560 | 3/1986 | Banike | |
| 4,625,928 | 12/1986 | Peekna | |
| 4,666,821 | 5/1987 | Hein et al. | 430/327 |
| 4,676,161 | 6/1987 | Peekna | |
| 4,702,994 | 10/1987 | Rendulic et al. | 430/327 |
| 4,817,527 | 4/1989 | Wouch et al. | |
| 4,857,437 | 8/1989 | Banks et al. | 430/327 |
| 4,948,940 | 8/1990 | Rucki | 219/121.68 |
| 5,041,359 | 8/1991 | Kooi | 430/327 |

FOREIGN PATENT DOCUMENTS

| | | |
|---|---|---|
| 396259 | 11/1990 | European Pat. Off. |
| 143538 | 8/1980 | Fed. Rep. of Germany |
| 637330 | 7/1983 | Switzerland |
| 876827 | 9/1961 | United Kingdom ............ 101/401.1 |

Primary Examiner—Christopher D. Rodee
Attorney, Agent, or Firm—Wood, Phillips, VanSanten, Hoffman & Ertel

[57] ABSTRACT

A method and associated apparatus for forming an image replication medium on a surface of a printing plate or cylinder in which the surface is initially coated with a layer of photopolymer liquid. Thereafter, selected areas of the layer of liquid coated on the surface are hardened by exposure to a beam produced by a computer controlled laser to provide a surface cylinder having an image replication medium with a desired pattern.

11 Claims, 3 Drawing Sheets

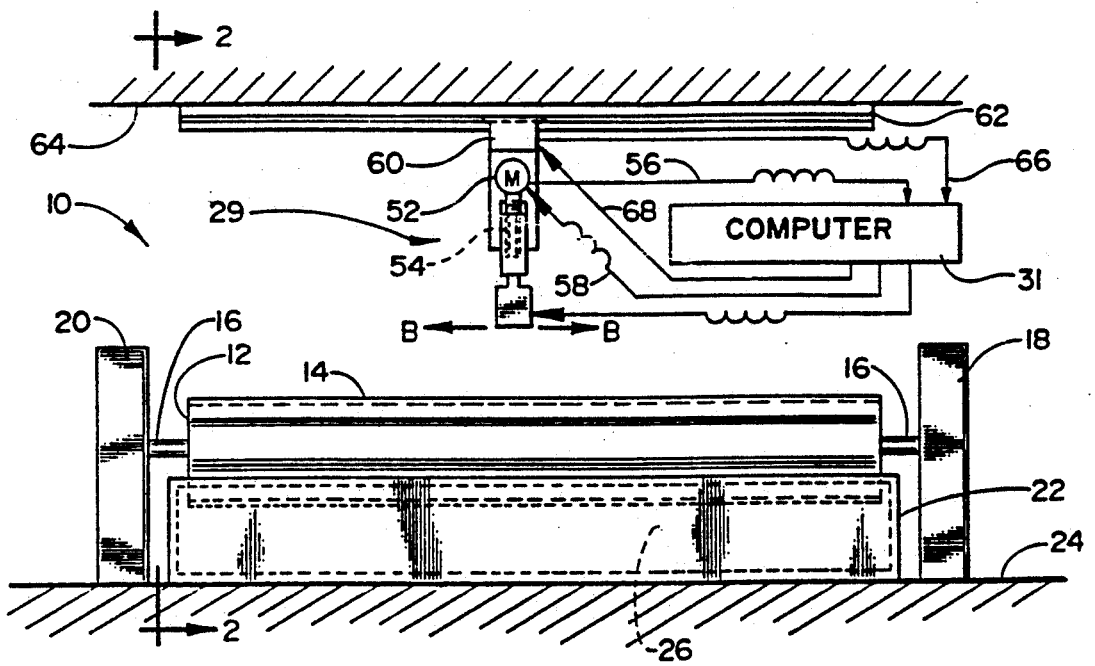
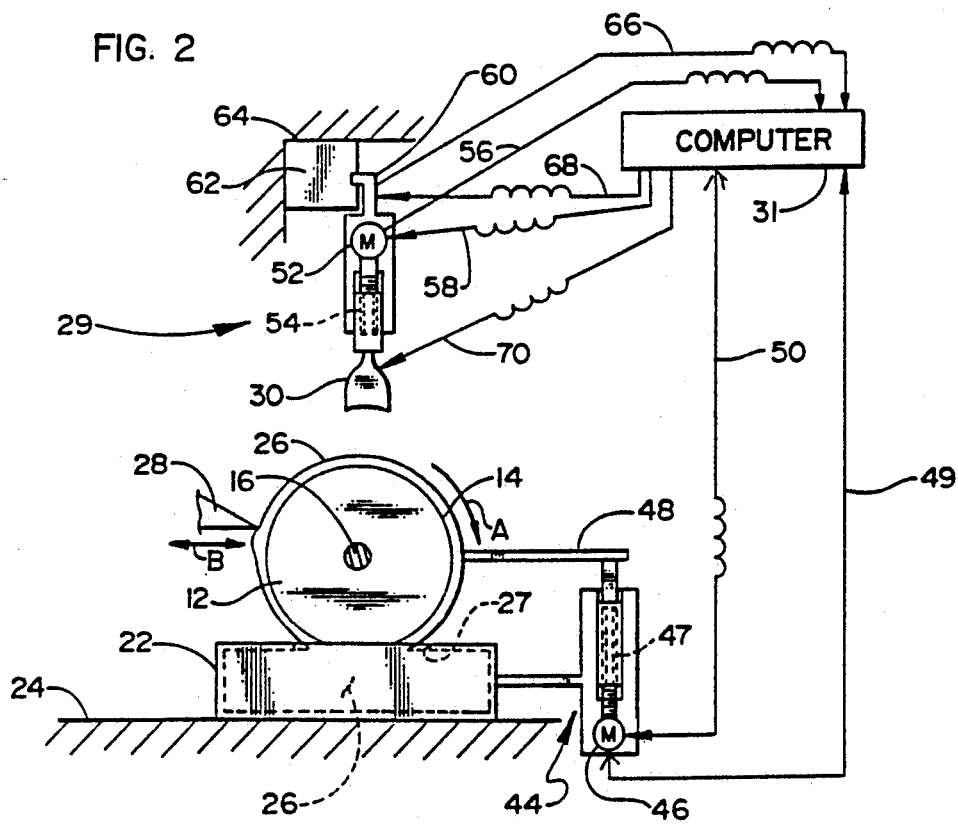
FIG. 2

METHOD AND APPARATUS FOR MAKING PRINT IMAGING MEDIA

CROSS-REFERENCE TO RELATED APPLICATION

This is a continuation-in-part of U.S. application Ser. No. 07/321,292, filed on Mar. 8, 1989 now abandoned.

FIELD OF THE INVENTION

This invention relates to printing, and more particularly, to a method and apparatus for forming an image replication medium on a printing surface.

BACKGROUND OF THE INVENTION

A printing surface has an image replication medium for printing an image on a substrate. The image replication medium for use in connection with a letterpress or lithographic printing cylinder may include a printing surface wherein ink coated on the printing surface is transferred to the surface of the substrate. Alternatively, the image replication medium may be a plurality of cells or wells in a gravure printing cylinder wherein ink contained in the cells is transferred to the surface of the substrate.

Gravure printing plates are generally produced by a mechanical engraving process wherein image information, which may be optically scanned from a copy or derived from computer memory, is used to direct a diamond stylus to cut a plurality of cells in the surface of the plate. Alternatively, the gravure printing plate may be produced by a chemical etching process.

An offset or lithographic printing plate is generally produced by a process wherein a plate coated with a photopolymer is exposed by suitable light through a film (negative or positive) which contains the image to be printed.

Conventionally, the plate is wrapped around a carrier cylinder. A gap or space is obtained between the ends of the plate that extend the length of the carrier cylinder when the plate is put on the carrier cylinder. This gap causes vibrations as it passes over the substrate that can damage the printing equipment. Furthermore, printing cannot occur at the gap which results in a blank spot on the substrate.

The present invention is directed to a novel method and associated apparatus for producing an image replication medium.

SUMMARY OF THE INVENTION

It is an object of this invention to provide a method and apparatus for forming an image replication medium on a printing surface.

In accordance with this invention, a method of forming an image replication medium on a surface of a printing plate includes the steps of coating the surface with a layer of liquid, and selectively hardening portions of the layer of liquid on the surface to provide a surface having an image replication medium with a desired pattern.

A feature of the invention is that the coating and hardening steps may be repeated.

A further feature of the invention is that an image replication medium may be formed on a surface of a cylinder. The method includes the steps of rotating the cylinder through a bath containing a photopolymer liquid so that the surface thereof is coated with a layer of liquid, and selectively hardening portions of the liquid on the surface to provide an image replication medium having a desired pattern. The image replication medium can be formed without an undesirable gap or space extending along the length of the cylinder. Therefore, when the cylinder having the image replication medium thereon is placed in a printing apparatus, the gap-induced vibrations and blank spots on the substrate are avoided.

Another feature of the invention is that a computer controlled laser is provided for hardening the predetermined portions of the layer of photopolymer on the surface of the cylinder.

A further feature of the invention is that a digital micrometer is provided for adjusting the spacing between the laser and the surface of the cylinder. Further, a digital micrometer device is provided for adjusting the location of the cylinder with respect to the bath.

Yet a further feature of the invention is that the laser is mounted on a track for movement longitudinally along the surface of the cylinder.

Further features and advantages of this invention will readily be apparent from the specification and from the drawings.

BRIEF DESCRIPTION OF THE DRAWINGS

FIG. 1 is a schematic view of an apparatus for forming an image replication medium on a surface of a cylinder according to the present invention;

FIG. 2 is a section along line 2—2 of FIG. 1;

DESCRIPTION OF THE INVENTION

Figure 3:
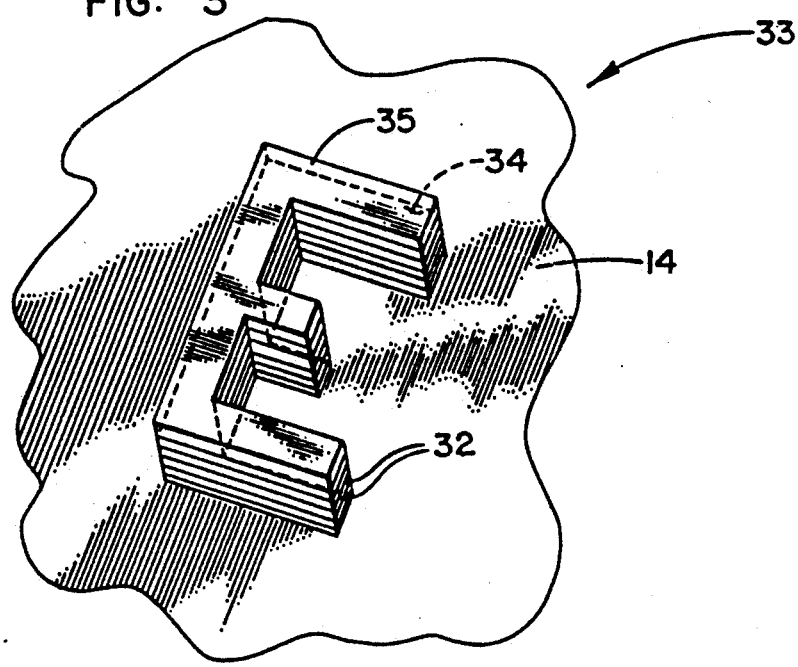
FIG. 3 is a perspective view, on an enlarged scale, illustrating a portion of an image replication medium on the surface of a cylinder with a raised printing surface in the form of the letter "E" for use in connection with letterpress printing.

Referring first to FIG. 1, an apparatus 10 for forming an image replication medium according to the present invention is shown. A printing cylinder 12 having an outer surface 14 is mounted on a shaft 16 and is positioned between supports 18 and 20 for rotation by a motor (not shown). A bath 22 is situated below the cylinder 12 on a support surface 24 and extends the length of the cylinder 12. The bath 22 contains a commercially available photopolymer liquid 26. As shown in FIG. 2, the bath 22 further includes an opening 27. As shown in FIGS. 1 and 2, the cylinder 12 is positioned above the bath 22 such that a portion of the outer surface 14 of the cylinder 12 is located within the opening 27. A doctor blade 28 extends substantially to the surface 14 of cylinder 12.

The cylinder 12 can be a printing cylinder or a manufacturing cylinder. A printing cylinder is one which is removed from the image forming apparatus 10 and is put in its entirety on a printing press. A manufacturing cylinder is one which has a removable carrier plate upon which the image is formed. Subsequently, the carrier plate is removed from the cylinder and put on a carrier cylinder of the printing press.

In the preferred method for forming an image replication medium, and as shown in FIG. 2, the cylinder 12 is rotated in the direction of arrow A through the bath 22 containing the liquid photopolymer 26 so that the surface 14 of cylinder 12 is coated with a layer of liquid 26. Once coated, the layer of liquid 26 is reduced to a desired uniform thickness by doctor blade 28. As shown in FIG. 2, the doctor blade may be moved in the direction of arrows B to adjust the thickness of the layer of liquid 26, as desired.

As the cylinder 12 rotates further, the initial layer of liquid 26 passes under a laser apparatus, generally designated 29, comprised of a laser 30 which produces a beam of laser energy (not shown) in response to instructions from a computer 31. According to the invention, selected areas of the layer of photopolymer liquid are cured (i.e., hardened) by exposure to the laser beam. It is understood that the strength of laser energy required to cure the liquid is in part dependent upon the thickness of the layer of liquid 26 as determined by the location of doctor blade 28 with respect to the surface 14 of cylinder 12.

As cylinder 12 continues to rotate, surface 14 of cylinder 12 is coated with an additional layer of liquid 26. Once coated, doctor blade 28 is adjusted by movement away from the surface 14 of cylinder 12 to assure that the thickness of the additional layer of liquid is uniform and equal to the thickness of the initial layer. As with the initial layer of liquid, the additional layer then passes under the laser 30 and selected areas thereof are cured (i.e., hardened) by exposure to the laser beam.

The image replication medium formed on the cylinder 12 can be continuous therefore lacking any undesirable gaps or spaces extending along the length of the cylinder 12. Therefore, when the cylinder 12 with image replication medium thereon is placed in a printing apparatus, gap-induced vibrations and blank spots are eliminated.

Figure 4:
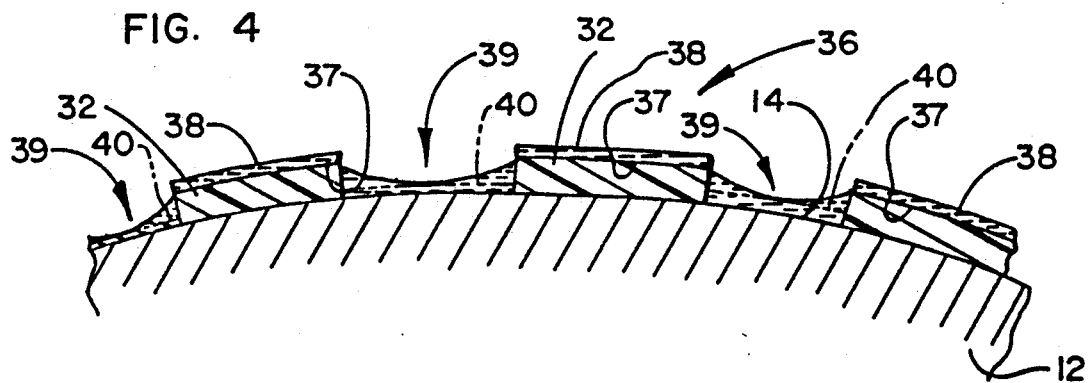
FIG. 4 is a section on an enlarged scale, illustrating a portion of an image replication medium on the surface of a cylinder including a printing surface for use in connection with lithographic printing.

The above-described rotating and hardening steps are repeated to produce an image replication medium, as shown in FIGS. 3 and 4.

As shown in FIG. 3, the method and apparatus according to the present invention may be used to form an image replication medium, generally designated 32, including a raised printing surface 34 on the outer surface 14 of cylinder 12 for use in connection with a letterpress printing cylinder wherein ink 35 coated on the raised printing surface is transferred to the surface of a substrate. Although not shown in FIGS. 1-3, it is noted that the uncured (i.e., unhardened) portions of layers of photopolymer liquid surrounding raised printing surface 34 are removed by rinsing with a suitable solvent which, in turn, is removed by air drying, or the like. As shown therein, the raised printing surface 34, in the form of the letter "E", is comprised of a plurality of cured (i.e., hardened) portions of layers of photopolymer liquid 26.

Alternatively, and as shown in FIG. 4, the method and apparatus of the present invention may be used to form an image replication medium, generally designated 36, including printing surfaces 37 on the outer surface 14 of cylinder 12 for use in connection with a lithographic printing cylinder wherein ink 38, on printing surfaces 37, is transferred to the surface of a substrate. Unlike the raised printing surface 34 shown in FIG. 3 which comprises a plurality of cured portions of layers of photopolymer liquid 26, the printing surfaces 37 shown in FIG. 4 typically comprise cured portions of a single layer of photopolymer liquid 26. As a result, and unlike the raised printing surface 34 shown in FIG. 3, the printing surfaces 37 shown in FIG. 4 are not sufficiently high to keep ink 38 out of the uncured (i.e., unhardened) areas, generally designated 39. In an alternative embodiment (not shown), the printing surfaces of an image replication medium for use in a lithographic printing operation can have multiple cured layers of photopolymer liquid. However, these printing surfaces are not sufficiently high to keep ink out of the uncured areas.

In light thereof, it is necessary that the following conventional steps be taken in the formation of an image replication medium for use in connection with a lithographic printing cylinder in addition to the steps described above with respect to the formation of an image replication medium for use in connection with a letterpress printing cylinder, as shown in FIG. 3. In lithographic applications, once the uncured portions of layers of photopolymer liquid are removed from areas 39, the surface 14 and preferably only areas 39 are coated with an aqueous gum arabic solution 40 (i.e., fountain solution) having a hydrophilic property to repel ink 38. Once the solution 40 is applied, the surface 14 is dried. Thereafter, and although not required for all lithographic printing applications, there may optionally be performed the further step of coating the printing surfaces 37 with a material which further enhances the attraction of ink 38. Since the ink 38 utilized in lithographic printing applications is oil-based and hydrophobic in property, separation between printing surfaces 37 and areas 39 is maintained notwithstanding the slight difference in height between surfaces 37 and areas 39.

Figure 5:
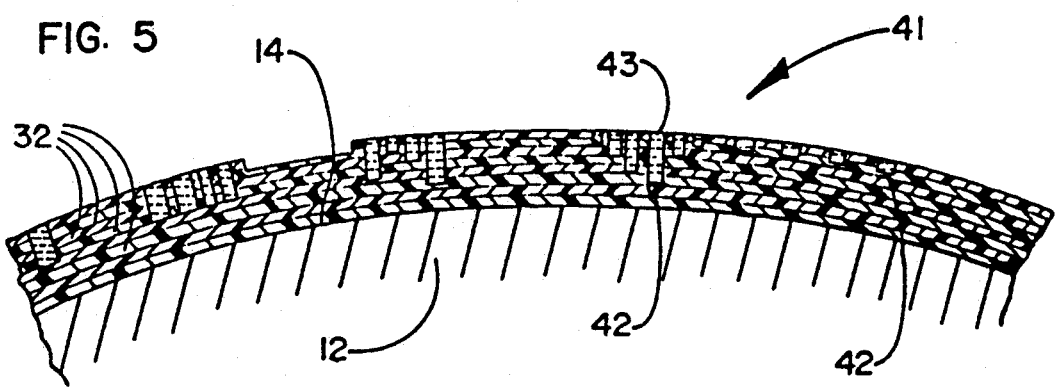
FIG. 5 is a section on an enlarged scale, illustrating a portion of an image replication medium on the surface of a cylinder including a plurality of cells for use in connection with gravure printing.

Alternatively, and as shown in FIG. 5, the method and apparatus of the present invention may be used to form an image replication medium generally designated 41, on the outer surface 14 of cylinder 12, having a plurality of cells or wells 42 for use in connection with a gravure printing cylinder wherein ink 43 contained within wells 42 is transferred to the surface of the substrate upon which the image is to be printed The image replication medium 41 would be useful in a gravure printing system. A conventionally metal coating can be applied to the imaging application medium 41 to increase the useful life thereof. A suitable coating metal is chromium.

As shown in FIG. 2, the apparatus 10 according to the invention further includes a digital micrometer device, generally designated 44, for adjusting the location of cylinder 12 with respect to bath 22. The device 44 comprises a motor 46 including a position sensor (not shown) which drives a screw 47 fixed to a horizontal extending shaft 48. The shaft 48, in turn, is mounted to shaft 16 of cylinder 12. The device 44 is responsive to instructions from computer 31 via motor drive input signal 49 and position sensor feedback output signal 50.

According to the invention, adjustment of the location of cylinder 12 serves a two-fold purpose. Initially, it assures that the surface 14 of cylinder 12 is continually coated with an additional layer of photopolymer liquid 26 upon successive rotation of cylinder 12 into bath 22. Further, it assures that the surface 14 of cylinder 12 is continually coated with a layer of photopolymer liquid 26 of an appropriate thickness.

As shown in FIGS. 1 and 2, apparatus 10 additionally includes a digital micrometer device, similar to device 44, for adjusting the spacing between laser 30 and the surface 14 of cylinder 12. The device comprises a motor 52 having a position sensor (not shown) which drives a screw 54. The device is responsive to instructions from computer 31 via motor drive input signal 56 and position sensor feedback output signal 58. The device assures that the spacing (i.e., distance) between laser 30 and surface 14 of cylinder 12 will remain appropriate notwithstanding the continual coating of surface 14 with additional layers of photopolymer liquid 26 or the adjustment of cylinder 12 with respect to bath 22.

As further shown in FIGS. 1 and 2, the curing of selected areas of the layer of photopolymer liquid 26 is made possible by mounting the laser apparatus 29 by means of a bracket 60 to a horizontal track 62 located above the cylinder 12 and fixed to a horizontal support structure 64. The track 62 allows the laser apparatus 29 to move longitudinally in the direction of arrows B, in response to instructions from computer 31 via input signal 66 and output signal 68, along the entire length of cylinder 12. Therefore, as laser apparatus 29 moves longitudinally along the length of cylinder 12, the beam of laser energy produced by laser 30 contacts selected areas of the layer photopolymer liquid 26 to harden the same.

Alternatively, it is understood that the laser apparatus 29 may be fixed to support surface 64 such that it remains stationary at all times. In that situation, the laser beam is deflected in response to instructions from computer 31 via output signal 70 to scan a specified length of cylinder 12.

According to the invention, the formation of the image replication medium in successive layers of photopolymer liquid 26 from the surface 14 of cylinder 12 offers the advantage of an image replication medium having enhanced curing and durability characteristics.

Although the apparatus and method of the present invention have been described with respect to the formation of an image replication medium on the surface of a cylinder, the method and apparatus is likewise applicable for forming an image replication medium on a surface of a flat printing plate. In that particular application, a flat plate is substituted for the printing cylinder 12 depicted in FIGS. 1 and 2. The plate is coated with a layer of photopolymer liquid as by spraying the liquid on the surface of the plate or by lowering the plate into a bath similar to the bath disclosed in FIGS. 1 and 2. Once the surface has been coated, a squeegee or the like may be used to assure that the layer of liquid is of uniform and desired thickness. Appropriate areas of the liquid layer are then hardened. The coating and hardening steps are repeated until the replication medium has the desired thickness. Once the replication medium is formed, the flat plate, which is typically comprised of a flexible material such as aluminum or the like, may, if desired, be bent and clamped to the surface of printing cylinder 12.

Figure 6A:
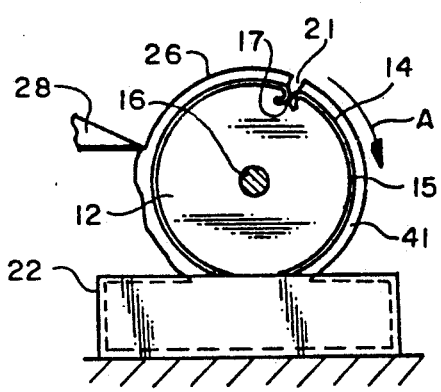
FIGS. 6A, 6B and 6C are schematic views of a sequence for forming an image replication medium on a carrier plate, removing the carrier plate and using the carrier plate on a conventional printing apparatus.
Figure 6B:
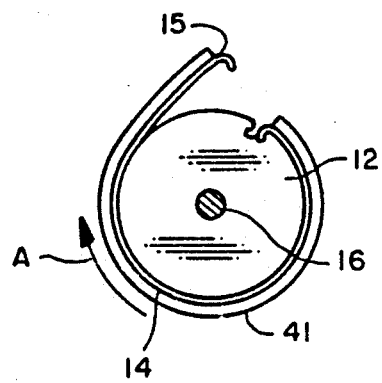

FIG. 6A shows the manufacturing cylinder 12A having a carrier plate 15 thereon. The ends of the carrier plate 15 are secured to the manufacturing cylinder 12A by conventional means which result in a carrier plate gap 17. An image replication medium gap 21 is formed in the image replication medium 41 during production as a result of the carrier plate gap 17. FIG. 6B shows the carrier plate 15 with the image replication medium 41 thereon being removed from the manufacturing cylinder 12A.

Figure 6C:
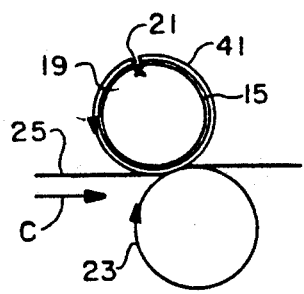

FIG. 6C shows a carrier cylinder 19 and a conventional impression cylinder 23 of a conventional printing apparatus. The carrier plate 15 is conventionally secured to the carrier cylinder 19. The cylinders 19 and 23 rotate in the direction indicated by their respective arrowheads. Paper 25 is passed between the carrier cylinder 19 and the impression cylinder 23 in the direction indicated by the arrow C. The pressure exerted on the paper 25 by the action of the carrier cylinder 19 and the impression cylinder 23 results in the image of the image replication medium 41 being printed on the paper 25.

Figure 7:
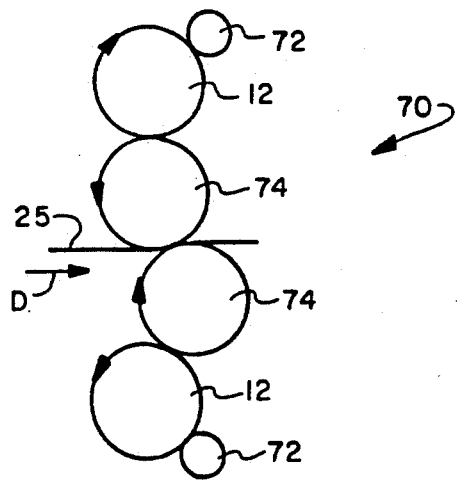
FIG. 7 is a schematic view of printing section of an offset printing apparatus.

When the printing cylinder 12 is a letter press printing cylinder, it can be utilized in an offset printing apparatus. A printing section 70 of a conventional offset printing apparatus is illustrated in FIG. 7. The printing section 70 includes the inking system 72, the printing cylinders 12 and the blank cylinders 74. The cylinders rotate in the direction indicated by their respective arrowhead. Paper 25 is fed between the upper and lower blanket cylinders 74 in the direction indicated by the arrow D. In operation, rotation of the printing cylinders 12 causes the image replication medium (not shown) to receive ink from the inking system 72. Continued rotation causes the ink on the image replication medium to be transferred to the operable associated blanket cylinder 74 which then transfers the ink to the paper 25 in the desired image.

The foregoing detailed description is given for clearness of understanding only and no unnecessary limitations should be understood therefrom, as modifications will be obvious to those skilled in the art.

I claim:

1. A method of forming an image replication medium on the surface of a cylinder for printing an image on a substrate, said method comprising the steps of:
    rotating said surface through a bath of photopolymeric liquid such that said surface is coated with a layer of said liquid;
    hardening selected areas of said liquid layer, outside said bath, with a beam from a laser to form raised areas which negatively or positively define said image, said laser being controlled by a computer for selective hardening of said liquid layer;
    rotating said surface having hardened selected areas through the bath such that said surface, including said hardened selected areas, is coated with an additional liquid layer;
    hardening said additional liquid layer on said selected areas with a beam from a laser, said laser being controlled by a computer, so that said raised areas are layered; and
    removing unhardened photopolymeric liquid composition from said surface.

2. The method as recited in claim 1 wherein the image replication medium is continuous about the cylinder.

3. The method as recited in claim 1 wherein the printing surface is on a carrier plate and the cylinder is a manufacturing cylinder to which the carrier plate is secured.

4. The method as recited in claim 1 further including the step of adjusting the spacing between the laser and the surface of the cylinder.

5. The method as recited in claim 4 wherein said step of adjusting is performed by using a digital micrometer adjustment device.

6. The method as recited in claim 1 wherein said raised areas define gravure cells.

7. The method as recited in claim 1 wherein said raised areas define a raised letterpress printing image.

8. The method as recited in claim 1 wherein said printing surface is on a carrier plate and the cylinder is a manufacturing cylinder to which the carrier plate is secured.

9. The method in accordance with claim 8 further comprising the step of removing said carrier plate having hardened selected areas from said manufacturing cylinder.

10. The method as recited in claim 9 further comprising the step of securing said removed carrier plate to a carrier cylinder.

11. The method as recited in claim 1 wherein the image replication medium lacks an undesirable gap along a length thereof capable of inducing vibrations during rotation of the cylinder while printing or blank spots in the printing image.

* * * * *